US010574182B2

(12) United States Patent
Yang et al.

(10) Patent No.: US 10,574,182 B2
(45) Date of Patent: Feb. 25, 2020

(54) OSCILLATOR AND CONTROL METHOD

(71) Applicant: Realtek Semiconductor Corporation, Hsinchu (TW)

(72) Inventors: Yu-Che Yang, Hsinchu (TW); Sung-Jiun Tsai, Yunlin County (TW); Ka-Un Chan, Zhubei (TW)

(73) Assignee: REALTEK SEMICONDUCTOR CORPORATION, Hsinchu (TW)

(*) Notice: Subject to any disclaimer, the term of this patent is extended or adjusted under 35 U.S.C. 154(b) by 0 days.

(21) Appl. No.: 16/029,943

(22) Filed: Jul. 9, 2018

(65) Prior Publication Data
US 2019/0020307 A1 Jan. 17, 2019

Related U.S. Application Data

(60) Provisional application No. 62/532,376, filed on Jul. 14, 2017.

(30) Foreign Application Priority Data

May 17, 2018 (TW) .............................. 107116850 A

(51) Int. Cl.
H03B 5/12 (2006.01)
H03B 5/04 (2006.01)
(Continued)

(52) U.S. Cl.
CPC ............. *H03B 5/1212* (2013.01); *H03B 5/04* (2013.01); *H03B 5/1215* (2013.01);
(Continued)

(58) Field of Classification Search
CPC ......... H03L 7/10; H03L 1/022; H03L 7/1976; H03L 7/113; H03L 7/1974; H03L 2207/06; H03L 7/099; H03L 7/18; H03L 7/187; H03L 7/087; H03B 5/1212; H03B 5/1265; H03B 5/1243; H03B 2200/0208
(Continued)

(56) References Cited

U.S. PATENT DOCUMENTS 7,602,256 B2  10/2009  Talwalkar
8,004,367 B2   8/2011  Kythakyapuzha et al.
(Continued)

*Primary Examiner* — Arnold M Kinkead
(74) *Attorney, Agent, or Firm* — Locke Lord LLP; Tim Tingkang Xia, Esq.

(57) ABSTRACT

An oscillator includes a voltage-controlled oscillator (VCO) circuit and a processing circuit. The VCO circuit generates an oscillating frequency according to a digital signal, in which the oscillating frequency is a first oscillating frequency if the digital signal has a first signal value. The processing circuit determines a second signal value of the digital signal according to the first oscillating frequency and a target oscillating frequency, in order to tune the oscillating frequency to a second oscillating frequency. The processing circuit performs an interpolation operation according to a first frequency difference value between the target oscillating frequency and the first oscillating frequency and a second frequency difference value between the second oscillating frequency and the first oscillating frequency to determine a target signal value of the digital signal, in order to adjust the oscillating frequency to the target oscillating frequency.

14 Claims, 5 Drawing Sheets

(51) Int. Cl.
*H03L 7/00* (2006.01)
*H03L 7/18* (2006.01)
*H03L 7/099* (2006.01)

(52) U.S. Cl.
CPC ......... *H03B 5/1228* (2013.01); *H03B 5/1243* (2013.01); *H03B 5/1265* (2013.01); *H03L 7/00* (2013.01); *H03L 7/099* (2013.01); *H03L 7/0991* (2013.01); *H03L 7/18* (2013.01); *H03B 2201/0208* (2013.01)

(58) Field of Classification Search
USPC .................. 331/167, 34, 16, 177 V, 36 C
See application file for complete search history.

(56) References Cited

U.S. PATENT DOCUMENTS

2013/0265114 A1* 10/2013 Lee .................. H03L 7/095
    331/1 A
2014/0091864 A1* 4/2014 Wang ................ H03L 7/099
    331/16

\* cited by examiner

OSCILLATOR AND CONTROL METHOD

RELATED APPLICATIONS

This application claims priority to U.S. Provisional Application Ser. No. 62/532,376, filed Jul. 14, 2017, and Taiwan Application Serial Number 107116850, filed May 17, 2018, the disclosures of which are incorporated herein by reference in their entireties.

BACKGROUND

Technical Field

The present disclosure relates to an oscillator. More particularly, the present disclosure relates to a voltage-controlled oscillator circuit and a method control an oscillating frequency thereof.

Description of Related Art

An oscillating frequency of an oscillator may be determined according to an inductance value and a capacitance value of a resonant tank. In general, the oscillating frequency of the oscillator is tuned by controlling the capacitance value. However, when the environmental condition (e.g., temperature, voltage, etc.) varies, it takes a very long time to determine an appropriate control signal to set the capacitance value, in order to make the oscillator operate at an expected oscillating frequency.

SUMMARY

Some aspects of the present disclosure are to provide an oscillator that includes a voltage-controlled oscillator circuit and a processing circuit. The voltage-controlled oscillator circuit is configured to generate an oscillating frequency according to a digital signal, in which the oscillating frequency is a first oscillating frequency if the digital signal has a first signal value. The processing circuit is configured to determine a second signal value of the digital signal according to the first oscillating frequency and a target oscillating frequency, in order to tune the oscillating frequency to a second oscillating frequency. The processing circuit is further configured to perform an interpolation operation according to a first frequency difference value and a second frequency difference value to determine a target signal value of the digital signal, in order to adjust the oscillating frequency to the target oscillating frequency. The first frequency difference value is a difference between the target oscillating frequency and the first oscillating frequency, and the second frequency difference value is a difference between the second oscillating frequency and the first oscillating frequency.

Some aspects of the present disclosure are to provide a control method that includes the following operations: generating an oscillating frequency of a voltage-controlled circuit according to a digital signal, in which the oscillating frequency is a first oscillating frequency if the digital signal has a first signal value; determining a second signal value of the digital signal according to the first oscillating frequency and a target oscillating frequency, in order to tune the oscillating frequency to a second oscillating frequency; and performing an interpolation operation according to a first frequency difference value and a second frequency difference value to determine a target signal value of the digital signal, in order to adjust the oscillating frequency to the target oscillating frequency, in which the first frequency difference value is a difference between the target oscillating frequency and the first oscillating frequency, and the second frequency difference value is a difference between the second oscillating frequency and the first oscillating frequency.

As described above, with at least one of the above embodiments, the processing circuit is able to determine the target signal value efficiently, in order to control the VCO circuit to operate at the target oscillating frequency.

BRIEF DESCRIPTION OF THE DRAWINGS

This disclosure can be more fully understood by reading the following detailed description of the embodiments, with reference made to the accompanying drawings as follows.

DETAILED DESCRIPTION

The following embodiments are disclosed with accompanying diagrams for detailed description. For illustration clarity, many details of practice are explained in the following descriptions. However, it should be understood that these details of practice do not intend to limit the present disclosure. That is, these details of practice are not necessary in parts of embodiments of the present embodiments. Furthermore, for simplifying the drawings, some of the conventional structures and elements are shown with schematic illustrations.

In this document, the term "coupled" may also be termed as "electrically coupled," and the term "connected" may be termed as "electrically connected." "Coupled" and "connected" may mean "directly coupled" and "directly connected" respectively, or "indirectly coupled" and "indirectly connected" respectively. "Coupled" and "connected" may also be used to indicate that two or more elements cooperate or interact with each other.

Figure 1:
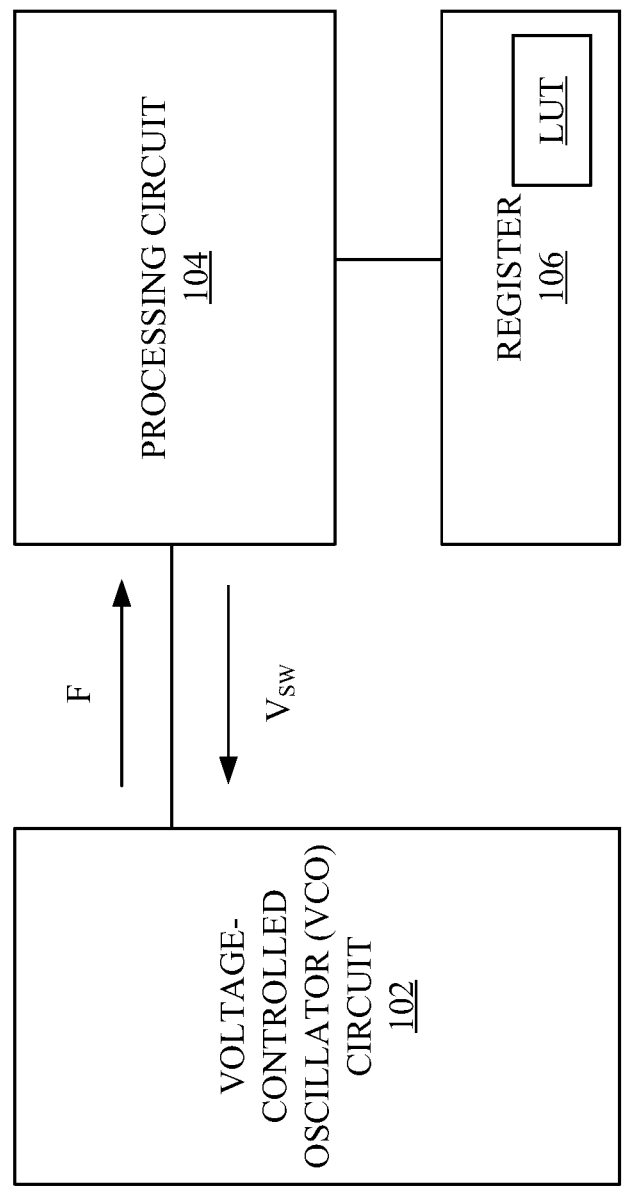
FIG. 1 is a schematic diagram of an oscillator according to some embodiments of the present disclosure.

FIG. 1 is a schematic diagram of an oscillator 100 according to some embodiments of the present disclosure. In some embodiments, the oscillator 100 includes a voltage-controlled oscillator (VCO) circuit 102, a processing circuit 104, and a register 106. The processing circuit 104 is coupled to the VCO circuit 102 and the register 106. The processing circuit 104 may provide the digital signal $V_{SW}$ to the VCO circuit 102. The VCO circuit 102 generates a corresponding oscillating frequency F according to the digital signal $V_{SW}$. The processing circuit 104 may detect the oscillating frequency F of the VCO circuit 102 operating based on the digital signal $V_{SW}$. For example, in some embodiments, the processing circuit 104 includes a counter. The counter is configured to count according to a signal having the oscillating frequency F generated from the VCO circuit 102, in order to generate different values. Thus, the processing circuit 104 is able to detect the oscillating frequency F according to these values.

The register 106 is configured to record corresponding relationships between different values of the digital signal $V_{SW}$ and the oscillating frequency F. For example, the corresponding relationships may be implemented as a look-up table LUT stored in the register 106. In some embodiments, when the processing circuit 104 detects the oscillating frequency F, the processing circuit 104 may acquire the signal value, corresponding to the oscillating frequency F, of the digital signal $V_{SW}$ from the look-up table LUT. For example, the processing circuit 104 may acquire the signal value of the digital signal $V_{SW}$ at a corresponding address of the look-up table LUT according to the value generated from the counter. The above arrangements of the processing circuit 104 and those of the register 106 are given for illustrative purposes, and the present disclosure is not limited thereto.

Figure 2:
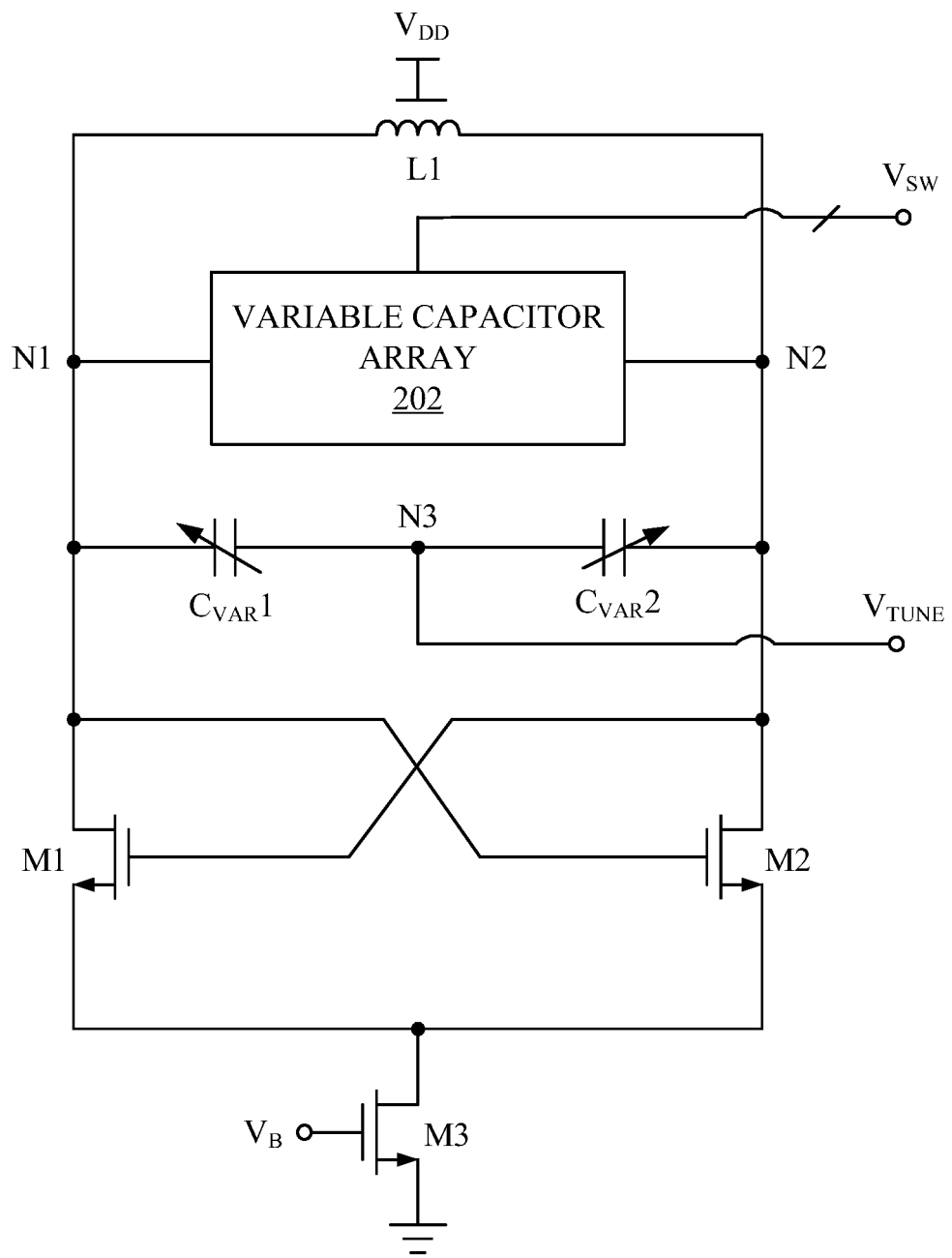
FIG. 2 is a schematic diagram of the VCO circuit in FIG. 1, according to some embodiments of the present disclosure.

FIG. 2 is a schematic diagram of the VCO circuit 102 in FIG. 1, according to some embodiments of the present disclosure. In some embodiments, the VCO circuit 102 includes a variable capacitor array 202, an inductor L1, a capacitor $C_{VAR}1$, a capacitor, a switch M1, a switch M2, and a switch M3. The inductor L1 receives a supply voltage $V_{DD}$. The variable capacitor array 202 and the inductor L1 are coupled to a node N1 and a node N2. The variable capacitor array 202 receives the digital signal $V_{SW}$, and determines a capacitance value of the variable capacitor array 202 according to the digital signal $V_{SW}$. The capacitor $C_{VAR}1$ is coupled between the node N1 and a node N3. The capacitor $C_{VAR}2$ is coupled between the node N3 and the node N2. The node N3 receives a control voltage $V_{TUNE}$, in order to determine a capacitance value of the capacitor $C_{VAR}1$ and that of the capacitor $C_{VAR}2$. For example, in some embodiments, the capacitor $C_{VAR}1$ and the capacitor $C_{VAR}2$ may be implemented with varactors. In some embodiments, the varactor may be implemented with a transistor. In this example, a gate of the transistor for implementing the varactor receives the control voltage $V_{TUNE}$. As a result, when the control voltage $V_{TUNE}$ varies, the capacitance value of the capacitor $C_{VAR}1$ and that of the capacitor $C_{VAR}2$ are varied correspondingly. The above implementations for the capacitors $C_{VAR}1$ and $C_{VAR}2$ are given for illustrative purposes only, and the present disclosure is not limited thereto.

The switches M1-M2 are cross-coupled. In other words, a control terminal of the switch M1 and one terminal of the switch M2 are coupled to the node N2, and a control terminal of the switch M2 and one terminal of the switch M1 are coupled to the node N1. The switch M3 is coupled between the switch M1 and ground, and is coupled between the switch M2 and ground. The switch M3 receives a control voltage $V_B$ and is employed as a constant current source. In some embodiments, the variable capacitor array 202, the inductor L1, the capacitor $C_{VAR}1$, and the capacitor $C_{VAR}2$ are configured as a resonant circuit. The switches M1-M2 are configured to generate a negative resistance to cancel parasitic resistance(s) of the resonant circuit. Accordingly, the VCO circuit 102 is able to generate a signal having the oscillating frequency F.

In some embodiments, the oscillating frequency F of the VCO circuit 102 may be derived as the following equation (1):

$$F = \frac{1}{2\pi\sqrt{LC}} \quad (1)$$

where C indicates an equivalent capacitance value of the variable capacitor array 202, the capacitor $C_{VAR}1$, and the capacitor $C_{VAR}2$, and L is the inductance value of the inductor L1.

As noted above, the capacitance value of the variable capacitor array 202 is determined according to the digital signal $V_{SW}$. If the capacitance value of the variable capacitor array 202 varies, the value of "C" in the equation (1) varies correspondingly, such that the oscillating frequency F of the VCO circuit 102 varies correspondingly. In other words, the oscillating frequency F of the VCO circuit 102 may be tuned by the digital signal $V_{SW}$.

The configurations of the VCO circuit 102 are given for illustrative purposes only, and various configurations of the VCO circuit 102 are within the contemplated scope of the present disclosure.

Figure 3:
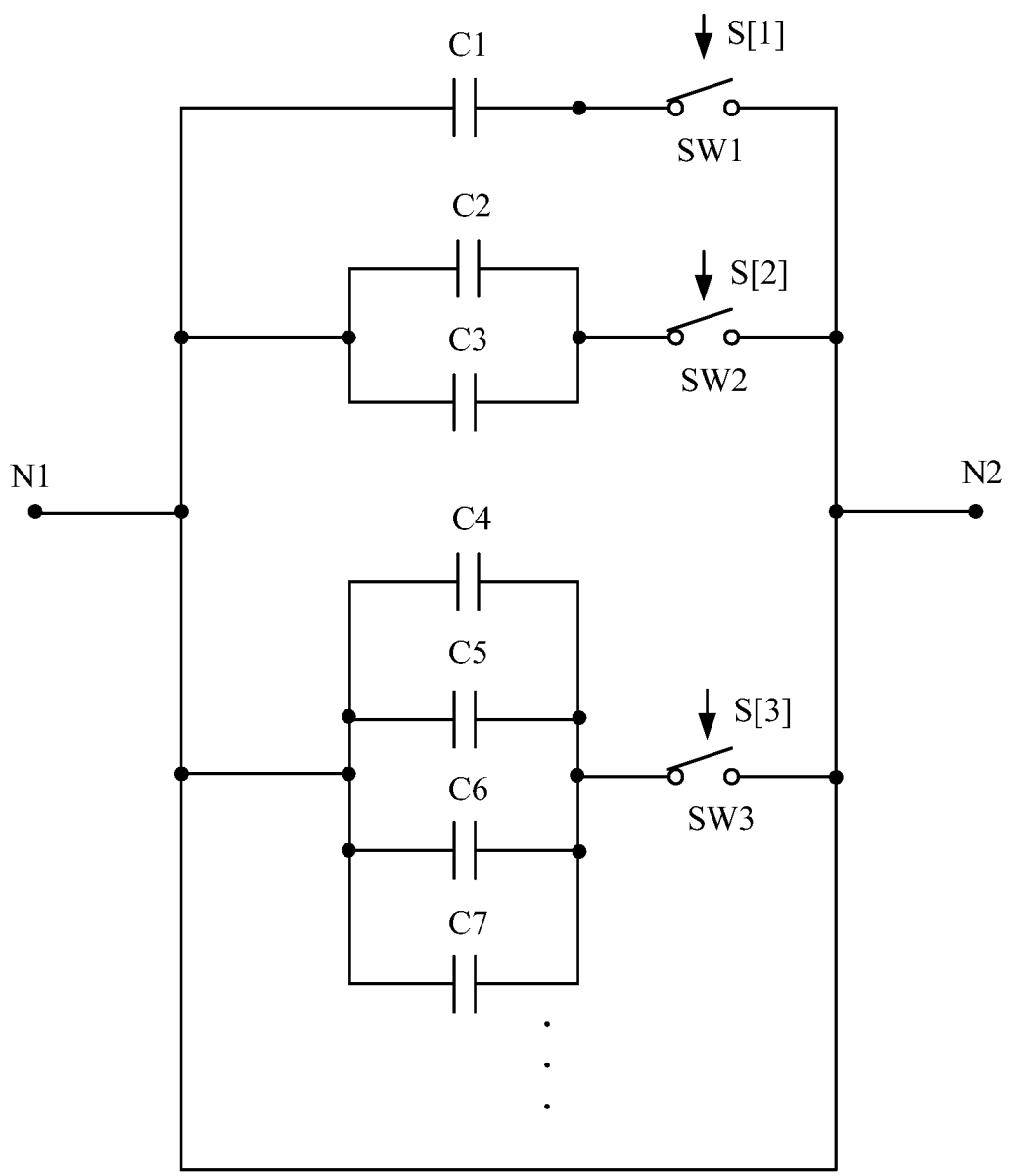
FIG. 3 is a schematic diagram of the variable capacitor array in FIG. 2, according to some embodiments of the present disclosure.

FIG. 3 is a schematic diagram of the variable capacitor array 202 in FIG. 2, according to some embodiments of the present disclosure. In some embodiments, the variable capacitor array 202 is a N-bit variable capacitor array, in which N is a positive number, A n-th bit of the variable capacitor array 202 corresponds to $2^{(n-1)}$ capacitors, in which n is a positive number less than or equal to N.

In some embodiments, the signal value of the digital signal $V_{SW}$ is formed with multiple bits which correspond to the N-bit variable capacitor array respectively. In the example of FIG. 3, a first bit S[1] of the signal value of the digital signal $V_{SW}$ corresponds to a first capacitor C1. A second bit S[2] of the signal value of the digital signal $V_{SW}$ corresponds to capacitors C2-C3. A third bit S[3] of the signal value of the digital signal $V_{SW}$ corresponds to capacitors C4-C7.

In greater detail, the capacitor C1 and the switch SW1 are coupled between the node N1 and the node N2 in series, in which the switch SW1 is controlled by the first bit S[1] of the signal value of the digital signal $V_{SW}$. The capacitor C2 and the capacitor C3 are coupled in parallel with each other, and the capacitors C2-C3 and the switch SW2 are coupled in series between the node N1 and the node N2, in which the switch SW2 is controlled by the second bit S[2] of the signal value of the digital signal $V_{SW}$. The capacitors C4-C7 are coupled in parallel with each other, and the capacitors C4-C7 and the switch SW3 are coupled in series between the node N1 and the node N2, in which the switch SW3 is controlled by the third bit S[3] of the signal value of the digital signal $V_{SW}$. With this analogy, the arrangement between the N-bit variable capacitor array and the digital signal $V_{SW}$ can be derived.

With the above arrangement, the capacitance value of the variable capacitor array 202 can be tuned by adjusting the digital signal $V_{SW}$. If the capacitance value of the variable capacitor array 202 is varied, the equivalent capacitance value of the variable capacitor array 202, the capacitor $C_{VAR}1$, and the capacitor $C_{VAR}2$ will be varied correspondingly. Based on the above equation (1), if the equivalent capacitance value varies, the oscillating frequency F of the VCO circuit 102 will be tuned correspondingly. The above variable capacitor array 202 is given for illustrative purposes only, various arrangements of the variable capacitor array 202 are within the contemplated scope of the present disclosure.

Figure 4:
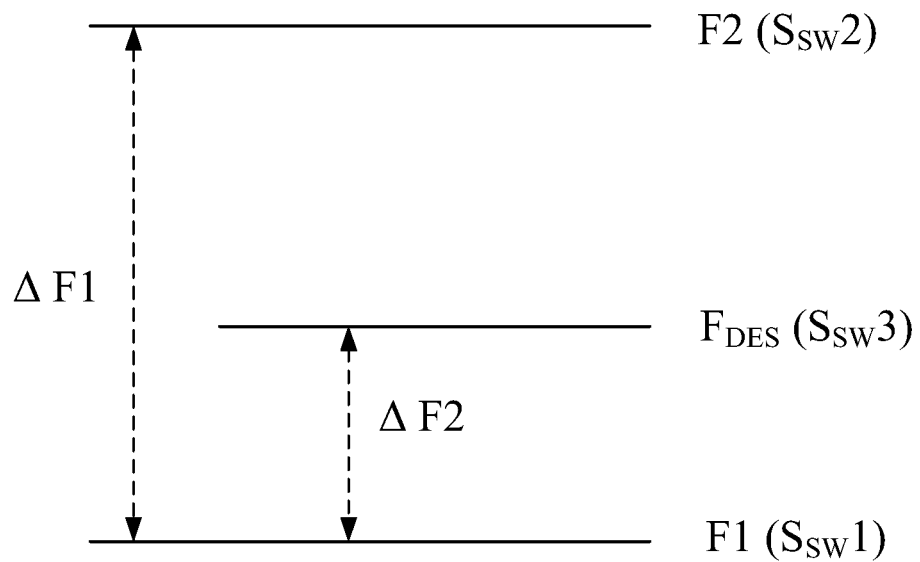
FIG. 4 is a schematic diagram illustrating the relationship among the first oscillating frequency, a second oscillating frequency, and a target oscillating frequency, according to some embodiments of the present disclosure.
Figure 5:
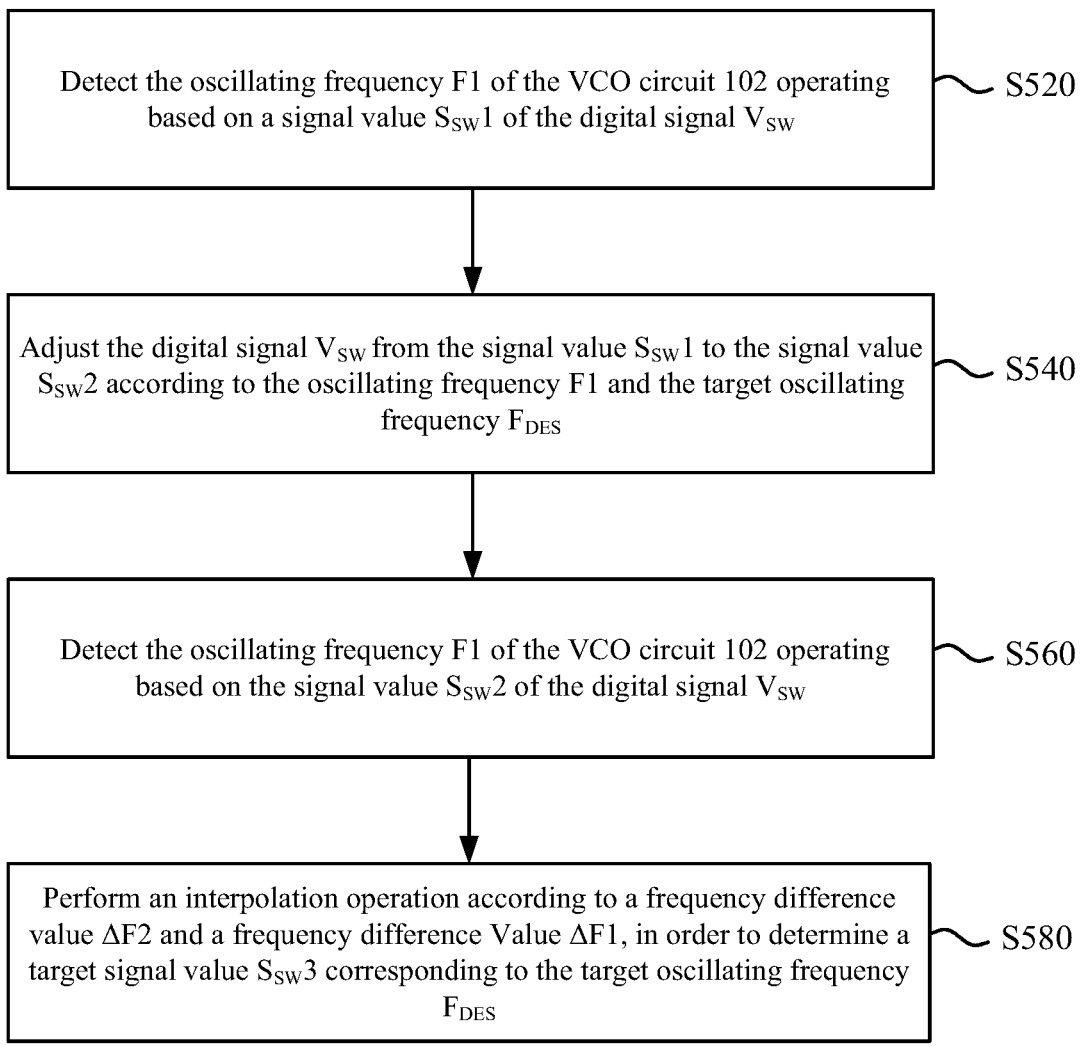
FIG. 5 is flow chart of a control method according to some embodiments of the present disclosure.

FIG. 4 is a schematic diagram illustrating the relationship among the oscillating frequency F1, an oscillating frequency F2, and a target oscillating frequency $F_{DES}$, according to some embodiments of the present disclosure. FIG. 5 is flow chart of a control method 500, according to some embodiments of the present disclosure. The following paragraphs will be described with reference to FIGS. 1-5.

In operation 5520, the processing circuit 104 detects the oscillating frequency F1 of the VCO circuit 102 operating based on a signal value $S_{SW}1$ of the digital signal $V_{SW}$. In some embodiments, when the oscillator 100 is powered on, the VCO circuit 102 generates an initial frequency (e.g., the oscillating frequency F1) according to the signal value $S_{SW}1$ of the digital signal $V_{SW}$. In some embodiments, the processing circuit 104 may acquire the signal value $S_{SW}1$, corresponding to the oscillating frequency F1, of the digital signal $V_{SW}$ from the look-up table LUT stored in the register 106 according to the oscillating frequency F1.

In operation 5540, the processing circuit 104 adjusts the digital signal $V_{SW}$ from the signal value $S_{SW}1$ to the signal value $S_{SW}2$ according to the oscillating frequency F1 and the target oscillating frequency $F_{DES}$. In some embodiments, the processing circuit 104 includes a frequency detector that is configured to compare the oscillating frequency F1 with the target oscillating frequency $F_{DES}$. If the oscillating frequency F1 is different from the target oscillating frequency $F_{DES}$, the processing circuit 104 adjusts the signal value $S_{SW}1$ to the signal value $S_{SW}2$ according to a predetermined value M.

For example, if the oscillating frequency F1 is lower than the target oscillating frequency $F_{DES}$, the processing circuit 104 generates the signal value $S_{SW}2$ to decrease the capacitance value of the variable capacitor array 202. As a result, the oscillating frequency F1 will be increased to a higher oscillating frequency. Alternatively, if the oscillating frequency F1 is higher than the target oscillating frequency $F_{DES}$, the processing circuit 104 generates the signal value $S_{SW}2$ to increase the capacitance value of the variable capacitor array 202. As a result, the oscillating frequency F1 will be decreased.

If the switches SW1-SW3 of the variable capacitor array 202 are implemented with N-type transistors, the processing circuit 104 subtracts the predetermined value M from the signal value $S_{SW}1$ to generate the signal value $S_{SW}2$ when the oscillating frequency F1 is lower than the target oscillating frequency $F_{DES}$, or sums up the predetermined value M and the signal value $S_{SW}1$ to generate the signal value $S_{SW}2$ when the oscillating frequency F1 is higher than the target oscillating frequency $F_{DES}$. If the signal value $S_{SW}1$ is 111 (i.e., S[3]=1, S[2]=1, S[1]=1). Under this condition, the switches SW1-SW3 are all turned on (i.e., closed), and thus the capacitors C1-C7 are coupled in parallel with each other. The capacitance value of the variable capacitor array 202 is substantially equal to the sum of the capacitance values of the capacitors C1-C7. If the oscillating frequency F1 is lower than the target oscillating frequency $F_{DES}$ (as shown in FIG. 4), the processing circuit 104 subtracts the predetermined value M (e.g., M=6, which corresponds to bits 110) from the digital signal $V_{SW}1$, to generate the signal value $S_{SW}2$ as 001. Under this condition, the switch SW1 is turned on and the switches M2 and M3 are turned off (i.e., open). Thus, the capacitance value of the variable capacitor array 202 substantially equals to the capacitance value of the capacitor C1. In other words, the capacitance value of the variable capacitor array 202 is decreased, in order to increase the oscillating frequency F1 to the oscillating frequency F2.

Alternatively, in other examples, if the switches SW1-SW3 of the variable capacitor array 202 are implemented with P-type transistors, the processing circuit 104 sums up the predetermined value M and the signal value $S_{SW}1$ to generate the signal value $S_{SW}2$ when the oscillating frequency F1 is lower than the target oscillating frequency $F_{DES}$, or subtracts the predetermined value M from the signal value $S_{SW}1$ to generate the signal value $S_{SW}2$ when the oscillating frequency F1 is higher than the target oscillating frequency $F_{DES}$. The operations regarding herein can be derived with the similar analogy according to the above paragraph, and thus the repetitious descriptions are not given herein.

In some embodiments, the capacitance values of the capacitors C1-C7 may be all the same or partially the same. In some embodiments, the predetermined value M can be adjusted according to the capacitance values of the capacitors C1-C7. For example, when the capacitance values of the capacitors C1-C7 are the same as each other and are higher, the predetermined value M is set to be lower. In some embodiments, the predetermined value M is determined according to the linearity requirement of the oscillator 100 as well. By setting the predetermined value M with considering the linearity requirement of the oscillator 100, a much accurate oscillating frequency F2 can be obtained, such that the accuracy of interpolation operation, as discussed below, can be increased.

In operation 5560, the processing circuit 104 detects the oscillating frequency F2 of the VCO circuit 102 operating based on the signal value $S_{SW}2$ of the digital signal $V_{SW}$. In some embodiments, when the signal value $S_{SW}1$ of the digital signal $V_{SW}$ is adjusted to the signal value $S_{SW}2$, the variable capacitor array 202 generates the oscillating frequency F2 based on the signal value $S_{SW}2$ of the digital signal $V_{SW}$. Accordingly, the counter of the processing circuit 104 is able to detect the oscillating frequency F2 generated by the variable capacitor array 202.

In operation 5580, the processing circuit 104 performs an interpolation operation according to a frequency difference value $\Delta F2$ and a frequency difference value $\Delta F1$, in order to determine a target signal value $S_{SW}3$ corresponding to the target oscillating frequency $F_{DES}$.

In some embodiments, the processing circuit 104 calculates the difference between the oscillating frequency F2 and the oscillating frequency F1 to determine the frequency difference value $\Delta F1$, and calculates the difference between the target oscillating frequency $F_{DES}$ and the oscillating frequency F1 to determine the frequency difference value $\Delta F2$. As shown in FIG. 3, in some embodiments, the processing circuit 104 is able to perform the interpolation operation according to the frequency difference value $\Delta F1$ and the frequency difference value $\Delta F2$, in order to efficiently determine the target signal value $S_{SW}3$ to which the target oscillating frequency $F_{DES}$ corresponds.

For example, the processing circuit 104 may determine a target adjust value P according to the frequency difference value $\Delta F1$, the frequency difference value $\Delta F2$, and the predetermined value M. In some embodiments, the target adjust value P is derived as the following equation (2):

$$P = \frac{\Delta F2}{(\Delta F1/M)} \quad (2)$$

Based on the above equation (2), the processing circuit 104 determines the amount (i.e., the target adjust value P) for the signal value of the digital signal $V_{SW}$ expected to be adjusted according to the predetermined value M and a ratio between the frequency difference value $\Delta F2$ and the frequency difference value $\Delta F1$. Then, the processing circuit 104 generates the target signal value $S_{SW}3$ according to the target adjust value P and the signal value $S_{SW}1$. In some embodiments, the target signal value $S_{SW}3$ may be derived from the following equation (3):

$$S_{SW}3 = S_{SW}1 + P \quad (3)$$

For example, if the signal value $S_{SW}1$ is 001 and P is 3 (which corresponds to bits of "011"), the target signal value $S_{SW}3$ is 100. Accordingly, the processing circuit 104 transmits the digital signal $V_{SW}$ having the target signal value $S_{SW}3$ to the variable capacitor array 202, in order to determine the statuses of the switches in the variable capacitor array 202 (e.g., turned on or off). By determining the statuses of these switches, the capacitance value of the variable capacitor array 202 can be adjusted. As a result, the equivalent capacitance value of the variable capacitor array 202, the capacitor $C_{VAR}1$, and the capacitor $C_{VAR}2$ can be adjusted to be substantially equal to a target capacitance value. Thus, this target capacitance value and the inductor value L of inductor L1 are able to tune the oscillating frequency of the VCO circuit 102 to the target oscillating frequency $F_{DES}$.

In other words, with the above equations (2)-(3), after acquiring these two oscillating frequencies F1 and F2, the processing circuit 104 is able to efficiently perform interpolation operation to obtain the target signal value $S_{SW}3$ according to these oscillating frequencies F1 and F2 and the corresponding signal values $S_{SW}1$ and $S_{SW}2$. In some related approaches, when environmental conditions (e.g., the operating temperature, voltage, etc.) are changed, it is required to re-establish the look-up table, which results in a waste of time. Compared with these approaches, the processing circuit 104 is able to efficiently determine the target signal value $S_{SW}3$. In some embodiments, the control method 500 may be performed repeatedly for multiple times, in order increase the accuracy of the target signal value $S_{SW}3$.

The above description of the control method 500 includes exemplary operations, but the operations of the control method 500 are not necessarily performed in the order described above. The operations of the control method 500 in the present disclosure may be added, replaced, omitted, or performed in different orders, in accordance with the spirit and scope of various embodiments of the present disclosure.

As described above, with at least one of the above embodiments, the processing circuit is able to determine the target signal value efficiently, in order to control the VCO circuit to operate at the target oscillating frequency.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. An oscillator, comprising:
   a voltage-controlled oscillator circuit configured to generate an oscillating frequency according to a digital signal, wherein the oscillating frequency is a first oscillating frequency if the digital signal has a first signal value; and
   a processing circuit configured to determine a second signal value of the digital signal according to the first oscillating frequency and a target oscillating frequency, in order to tune the oscillating frequency to a second oscillating frequency, wherein the processing circuit subtracts a predetermined value from the first signal value or sums up the predetermined value and the first signal value when the first oscillating frequency is different from the target oscillating frequency, to generate the second signal value of the digital signal,
   wherein the processing circuit is further configured to perform an interpolation operation according to a first frequency difference value and a second frequency difference value to determine a target signal value of the digital signal, in order to adjust the oscillating frequency to the target oscillating frequency,
   wherein the first frequency difference value is a difference between the target oscillating frequency and the first oscillating frequency, and the second frequency difference value is a difference between the second oscillating frequency and the first oscillating frequency.

2. The oscillator of claim 1, wherein the voltage-controlled oscillator circuit comprises a variable capacitor array, the variable capacitor array is configured to receive the digital signal, and a capacitance value of the variable capacitor array is determined according to the digital signal.

3. The oscillator of claim 2, wherein the processing circuit is further configured to compare the first oscillating frequency with the target oscillating frequency, in order to adjust the digital signal.

4. The oscillator of claim 2, wherein if the first oscillating frequency is lower than the target oscillating frequency, a capacitance value of the variable capacitor array is decreased according to the second signal value, and if the first oscillating frequency is higher than the target oscillating frequency, the capacitance value of the variable capacitor array is increased according to the second signal value.

5. The oscillator of claim 1, wherein if the first oscillating frequency is lower than the target oscillating frequency, the processing circuit subtracts the predetermined value from the first signal value to generate the second signal value, and if the first oscillating frequency is higher than the target oscillating frequency, the processing circuit sums up the predetermined value and the first signal value to generate the second signal value.

6. The oscillator of claim 1, wherein the processing circuit is further configured to determine a target adjust value according to a product of the predetermined value and a ratio between the first frequency difference value and the second frequency difference value, and to sum up the first signal value and the target adjust value to generate the target signal value.

7. The oscillator of claim 1, further comprising:
   a register configured to store a look-up table, wherein the processing circuit is further configured to acquire the first signal value of the digital signal from the look-up table according to the first oscillating frequency.

8. A control method, comprising:
   generating an oscillating frequency of a voltage-controlled oscillator circuit according to a digital signal, wherein the oscillating frequency is a first oscillating frequency if the digital signal has a first signal value;
   determining a second signal value of the digital signal according to the first oscillating frequency and a target oscillating frequency, in order to tune the oscillating frequency to a second oscillating frequency, wherein determining the second signal value of the digital signal comprises:
   subtracting a predetermined value from the first signal value or summing up the predetermined value and the first signal value when the first oscillating frequency is different from the target oscillating frequency, to generate the second signal value of the digital signal; and
   performing an interpolation operation according to a first frequency difference value and a second frequency difference value to determine a target signal value of the digital signal, in order to adjust the oscillating frequency to the target oscillating frequency, wherein the first frequency difference value is a difference between the target oscillating frequency and the first oscillating frequency, and the second frequency difference value is a difference between the second oscillating frequency and the first oscillating frequency.

9. The control method of claim 8, wherein the voltage-controlled oscillator circuit comprises a variable capacitor array, and a capacitance value of the variable capacitor array is determined according to the digital signal.

10. The control method of claim 9, further comprising:
comparing the first oscillating frequency with the target oscillating frequency, in order to adjust the digital signal.

11. The control method of claim 9, wherein if the first oscillating frequency is lower than the target oscillating frequency, decreasing a capacitance value of the variable capacitor array according to the second signal value, and if the first oscillating frequency is higher than the target oscillating frequency, increasing the capacitance value of the variable capacitor array according to the second signal value.

12. The control method of claim 8, wherein if the first oscillating frequency is lower than the target oscillating frequency, subtracting the predetermined value from the first signal value to generate the second signal value according to a difference value between the first signal value and the predetermined value, and if the first oscillating frequency is higher than the target oscillating frequency, summing up the predetermined value and the first signal value to generate the second signal value according to a sum of the first signal value and the predetermined value.

13. The control method of claim 8, wherein adjusting the digital signal comprises:
determining a target adjust value according to a product of the predetermined value and a ratio between the first frequency difference value and the second frequency difference value;
summing up the first signal value and the target adjust value to generate the target signal value; and
adjusting the digital signal to the target signal value, in order to tune the oscillating frequency to the target oscillating frequency.

14. The control method of claim 8, further comprising:
acquiring the first signal value of the digital signal from a look-up table according to the first oscillating frequency.

* * * * *